(12) United States Patent
Wimplinger et al.

(10) Patent No.: US 9,947,638 B2
(45) Date of Patent: Apr. 17, 2018

(54) DEVICE AND METHOD FOR PERMANENT BONDING

(71) Applicant: EV Group E. Thallner GmbH, St. Florian am Inn (AT)

(72) Inventors: Markus Wimplinger, Ried (AT); Bernhard Rebhan, Haag a. H. (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 15/306,591

(22) PCT Filed: Apr. 22, 2015

(86) PCT No.: PCT/EP2015/058739
§ 371 (c)(1),
(2) Date: Oct. 25, 2016

(87) PCT Pub. No.: WO2015/169603
PCT Pub. Date: Nov. 12, 2015

(65) Prior Publication Data
US 2017/0053892 A1 Feb. 23, 2017

(30) Foreign Application Priority Data

May 5, 2014 (DE) .................. 10 2014 106 231

(51) Int. Cl.
*H01L 21/00* (2006.01)
*H01L 23/00* (2006.01)
*H01L 21/67* (2006.01)

(52) U.S. Cl.
CPC ........ *H01L 24/83* (2013.01); *H01L 21/67092* (2013.01); *H01L 21/67144* (2013.01); *H01L 24/75* (2013.01); *H01L 2224/29147* (2013.01); *H01L 2224/75251* (2013.01); *H01L 2224/75343* (2013.01); *H01L 2224/8303* (2013.01); *H01L 2224/83193* (2013.01); *H01L 2224/83206* (2013.01); *H01L 2224/83207* (2013.01);
(Continued)

(58) Field of Classification Search
CPC ............... H01L 24/83; H01L 21/67092; H01L 21/67144; H01L 24/75
See application file for complete search history.

(56) References Cited

U.S. PATENT DOCUMENTS 8,926,775 B2    1/2015  Thallner .................. 156/228
9,067,363 B2    6/2015  Martinschitz et al. . B29C 65/74
(Continued)

FOREIGN PATENT DOCUMENTS

DE    10 2011 080 534 A1    2/2013    ............. B23K 20/10
EP         1 339 096 A2      8/2003    ............. H01L 21/00
(Continued)

OTHER PUBLICATIONS

International Search Report from corresponding International Patent Application No. PCT/EP2015/058739, dated Jun. 25, 2015.

*Primary Examiner* — Richard Booth
(74) *Attorney, Agent, or Firm* — Kusner & Jaffe

(57) ABSTRACT

A method and corresponding device for permanent bonding of a first layer of a first substrate to a second layer of a second substrate on a bond interface, characterized in that a dislocation density of a dislocation of the first and/or second layer is increased at least in the region of the bond interface before and/or during the bonding.

11 Claims, 6 Drawing Sheets

(52) U.S. Cl.
CPC ............... *H01L 2224/83895* (2013.01); *H01L 2924/20108* (2013.01)

(56) References Cited

U.S. PATENT DOCUMENTS

| | | | |
|---|---|---|---|
| 9,296,065 B2 | 3/2016 | Hesse et al. ........... | B23K 20/10 |
| 2010/0097738 A1* | 4/2010 | Kang .................. | H01L 21/6831 361/234 |
| 2011/0214809 A1 | 9/2011 | Sugiyama ..................... | 156/285 |
| 2014/0151439 A1 | 6/2014 | Hesse et al. ................ | 228/110.1 |
| 2014/0154867 A1 | 6/2014 | Martinschitz et al. ....... | 438/455 |
| 2014/0196842 A1 | 7/2014 | Martinschitz et al. ....... | 156/256 |
| 2014/0196846 A1 | 7/2014 | Thallner .................... | 156/306.3 |

FOREIGN PATENT DOCUMENTS

| | | | | |
|---|---|---|---|---|
| WO | WO 2012/152507 A1 | 11/2012 | ............. | H01L 21/67 |
| WO | WO 2013/029656 A1 | 3/2013 | ............. | H01L 21/60 |
| WO | WO 2013/110315 A1 | 8/2013 | ............. | B23K 20/22 |

* cited by examiner

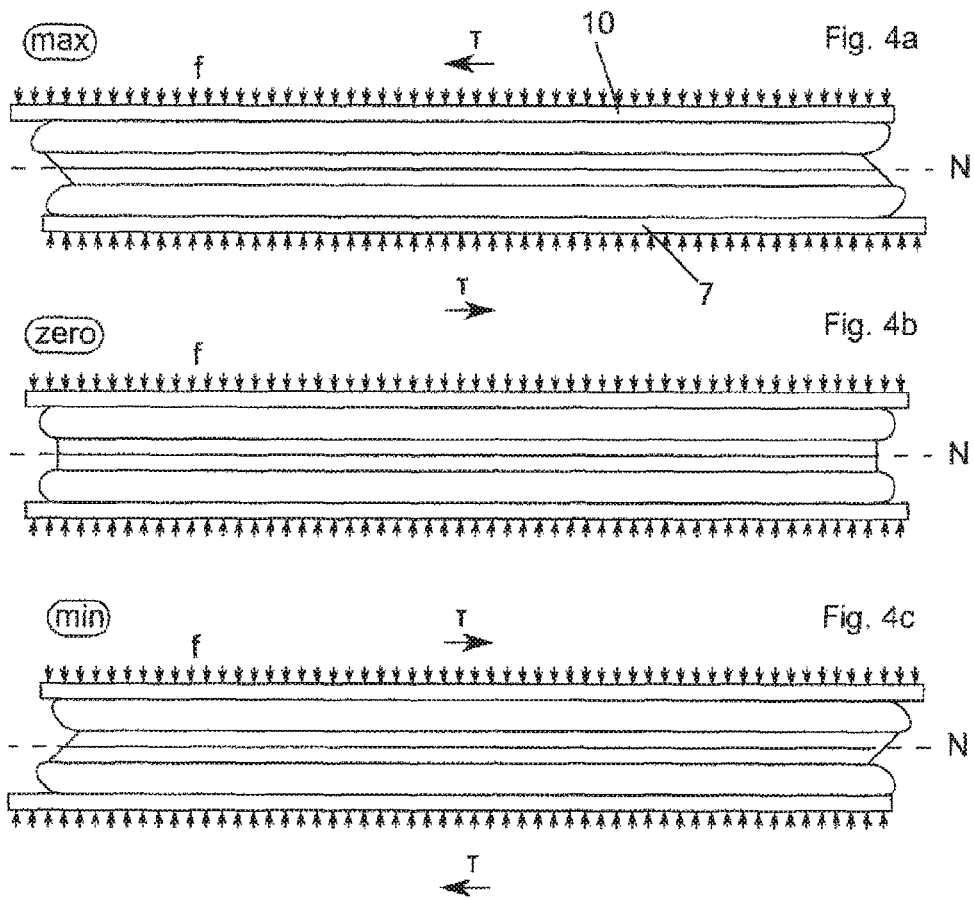
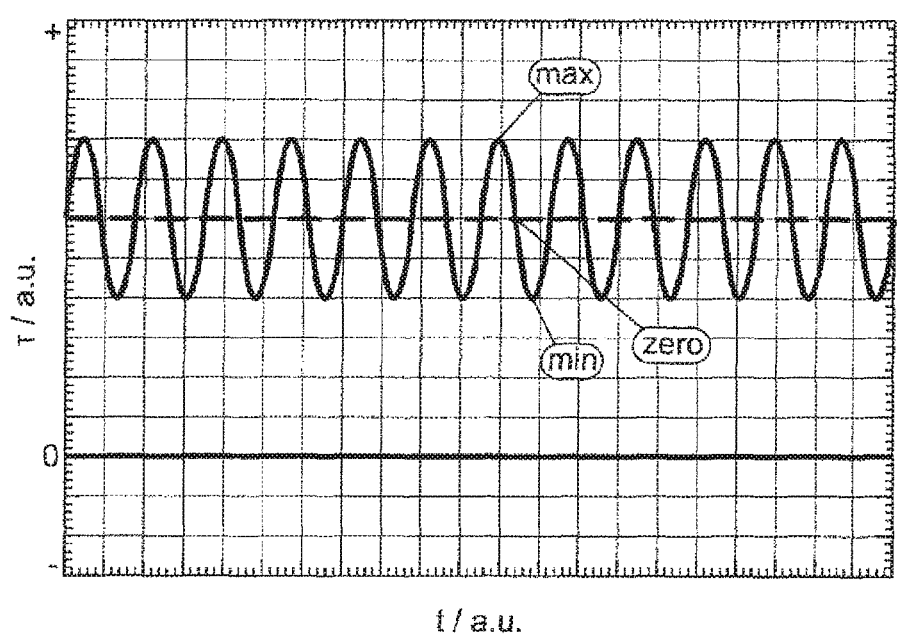

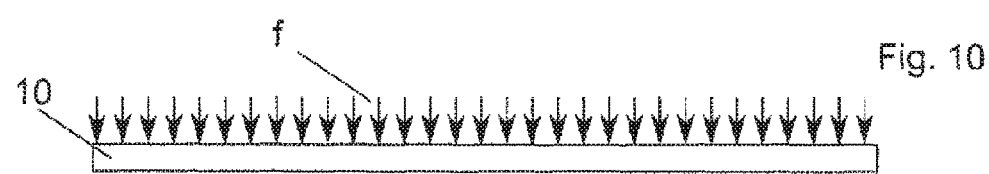
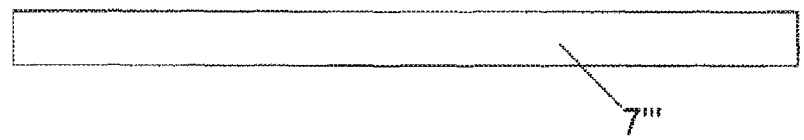
Fig. 10
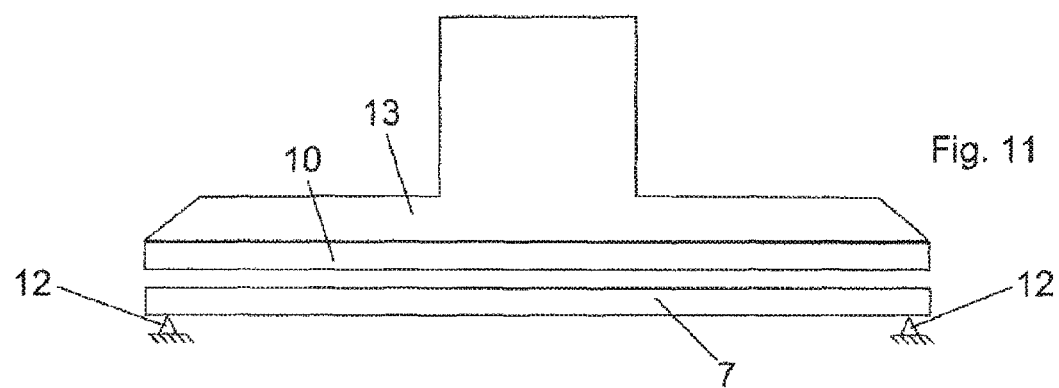
Fig. 11

DEVICE AND METHOD FOR PERMANENT BONDING

FIELD OF INVENTION

The invention relates to a method for permanent bonding of a first substrate to a second substrate and a device for permanent bonding of a first substrate to a second substrate.

In the methods known under the name wafer bonding, two substrates, especially wafers, (in particular from the materials silicon, quartz or any other materials) are joined to one another. Here it is first of all distinguished between temporary bonding and permanent bonding. Temporary bonding is defined as all methods in which two substrates, in particular two wafers, are joined to one another such that the product substrate can be stabilized and processed without detaching from the carrier substrate, at the end of the process chain in any case it can be removed again from the carrier substrate in a controlled manner. In permanent bonding on the other hand, the two substrates, in particular wafers, are bonded to one another with the objective of producing a lasting connection which can no longer be broken.

The following enumeration outlines the possibilities of permanent bonding. In microsystem technology wafer bonding can be used for example to bond a wafer with cavities to a second wafer which is provided with micromechanical and microoptical components in order to protect them. Permanent bonding is also used to produce a permanent connection between silicon surfaces or silicon oxide surfaces in a so-called direct bond method. Furthermore, with the permanent bonding method of diffusion bonding or of eutectic bonding also innumerable metal surfaces can be permanently joined to one another. These metal surfaces need not be applied as blanket coating to the wafer, but can be comprised of several locally limited coatings which are distributed over the entire wafer. In particular these locally limited coatings which are distributed over the entire wafer can be surrounded by a dielectric material, in particular silicon dioxide. These surfaces are then called hybrid surfaces. The hybrid surfaces are aligned to one another and are bonded to one another in a permanent bond method such that the electrically conductive metal surfaces and the dielectric regions bond to one another. In this way stacking of several substrates with simultaneous production of an electrically conductive connection is enabled.

There are therefore different types of bonding methods which in addition to the actual bond method also differ by the different types of materials of the wafers which are to be joined. One major disadvantage of currently used permanent bonding methods for metals is that the bond process leads to a satisfactory bond result only using very high heat supply and/or very high pressure. This very high thermal stress is also especially disadvantageous with respect to economical operation and is cost-intensive. Furthermore the construction and production of bonding systems which must apply corresponding high pressure in order to be able to bond wafers which are becoming larger and larger in a blanket and homogenous manner to one another are accordingly difficult. The production of corresponding bonding systems would fundamentally not be a problem if they could be built of any size. Bonding systems however must have certain dimensions which are stipulated by the semiconductor industry and must therefore be built to be correspondingly compact.

In addition to the indicated disadvantages of increased energy demand, substrate materials also react differently to increased heat supply, in which they have one thing in common. Heat supply always acts adversely on the substrate material used and can also lead to complete destruction of the substrate and in particular of the structures which are located on it.

SUMMARY OF INVENTION

Thus the object of this invention is to develop a method which makes it possible to implement a permanent connection of two substrate surfaces, in particular two metal surfaces as much as possible without the supply of heat, ideally at room temperature.

The surfaces of the substrates which are to be bonded to one another can be comprised of an electrically conductive material, an electrically nonconductive material or can have hybrid properties. In particular, bond methods are defined as those which are used to join hybrid surfaces to one another. As already explained, they are defined as surfaces which include at least one conductive and one nonconductive material. According to embodiments of the invention the conductive material is prepared for the bond process while the nonconductive surfaces can be bonded to one another according to known bond mechanisms. In order to illustrate embodiments of the invention as simply as possible, hereinafter preferably blanket metal surfaces which extend over the entire substrate are addressed. Furthermore the figures show solely blanket metal surfaces which extend over the entire substrate.

The invention relates in particular to permanent Cu—Cu bonding. The method of the invention can fundamentally be applied to all other materials and material combinations in which by means of embodiments of the invention at least one metastable state can be produced which preferably leads to recrystallization of the structure. In addition to the bonding of only two substrates, there is often a desire to form substrate stacks which can be produced with the method of the invention. In the production of these substrate stacks it is necessary to define an optimized sequence of the joining with consideration of the type of material and of the existing cavities. Especially preferably the metastable state is produced by an increased dislocation density. The embodiments of the invention can be applied especially to the following:
- metals, in particular
  - Cu, Ag, Au, Al, Fe, Ni, Co, Pt, W, Cr, Pb, Ti, Te, Sn, Zn
- alloys,
- semiconductors (with corresponding doping), in particular
  - element semiconductors, preferably
    - Si, Ge, Se, Te, B, α-Sn,
  - compound semiconductors, preferably
    - GaAs, GaN, InP, $In_xGa_{1-x}N$, InSb, InAs, GaSb, AlN, InN, GaP, BeTe, ZnO, $CuInGaSe_2$, ZnS, ZnSe, ZnTe, CdS, CdSe, CdTe, Hg(1-x)Cd(x)Te, BeSe, HgS, $Al_xGa_{1-x}As$, GaS, GaSe, GaTe, InS, InSe, InTe, $CuInSe_2$, $CuInS_2$, $CuInGaS_2$, SiC, SiGe.

Mainly in the bonding of substrates with functional units such as for example microchips, memory chips, or MEMs, the bond process should advantageously be carried out at low temperatures in order to preclude or minimize damage to electronic components. Furthermore, low temperature methods for the most part also preclude damage by intrinsic thermal stresses due to the difference in the coefficients of thermal expansion of different materials.

In particular substrates, mainly substrates with functional components such as microchips, memory modules, MEMs, etc., are aligned to one another before the actual bond process. The alignment process in a bond process is of special importance since only correct alignment and contact-making ensure the functionality of the electronic components. In low temperature bonding of two wafers of different types of materials which have different coefficients of thermal expansion, alignment is greatly simplified since there is no temperature difference or only a very small one which leads to different expansion of the two substrates which are comprised in particular of different materials. The accuracy of alignment which is carried out at room temperature is therefore preserved in low temperature bonding or changes only very little. Factors which influence alignment such as coefficients of thermal expansion can therefore be ignored for the most part. The use of such low temperatures has the disadvantage that bonding is much more difficult than in a bond process with higher temperatures (400° C.).

Therefore the object of the invention is to devise a method and a pertinent device which enables bonding of wafers even at low temperatures, preferably at room temperature.

The basic idea of the invention is in particular to achieve recrystallization which spreads over the bond interface in the bonding, in particular Cu—Cu bonding. In the recrystallization grain growth and/or structure modification by regeneration of grains and extension of the newly formed grain boundaries occur. Recrystallization is therefore defined as a regeneration of the structure by regeneration of grains and/or grain growth. In the bonding of two substrates the regeneration of the structure takes place preferably beyond the bond interface so that a continuous structure arises between the two substrates which are to be bonded, in particular on the layers which have been deposited on the substrates.

Hereinafter it will no longer be distinguished between the substrate surfaces and the surfaces of the layers which have been deposited on the substrates. Both expressions can be used synonymously.

In particular the first and/or second layers can be components of the first and/or second substrate.

For recrystallization in materials, in particular metals, at moderate temperatures, the materials can be provided with a high dislocation density, produced or chosen. The dislocation density is in particular greater than $10^7$ cm$^{-2}$, preferably greater than $10^9$ cm$^{-2}$, still more preferably greater than $10^{11}$ cm$^{-2}$, even more preferably greater than $10^{13}$ cm$^{-2}$, most preferably greater than $10^{15}$ cm$^{-2}$, most preferably of all greater than $10^{17}$ cm$^{-2}$. A dislocation is defined as a one-dimensional lattice defect which can arise either in the deposition of a material or which can be produced afterwards by plastic deformation in the crystal. A material with correspondingly high dislocation density is in particular in an at least metastable state and can be stopped by thermal activation from passing into a lower energy state by dislocation breakdown. The dislocation breakdown takes place preferably by recrystallization at higher temperatures and then results in a structure modification. A dislocation breakdown can take place alternatively at lower temperatures by annealing or crystal recovery. In a crystal recovery in any case the structure is not modified by recrystallization, but solely recombination of the dislocations takes place. This process is not desirable and should be avoided.

The dislocation density is increased by embodiments in which the dislocation is achieved both by individual pulse oscillations and/or continuing oscillations in the ultrasonic range. An individual pulse oscillation is defined in particular as one-time loading which will be detailed below. A continuing oscillation is defined in particular as several such loadings. Pulse oscillations cover in particular the entire bandwidth from high frequency to low frequency oscillations. The frequency of the oscillations is in particular between 1 Hz and $10^9$ Hz, preferably between 10 Hz and $10^8$, still more preferably between 100 Hz and $10^7$, most preferably between $10^4$ Hz and $10^6$. Contact-making of the oscillating embodiments with the substrates to be bonded produces a high frequency, oscillating mechanical load which produces a corresponding dislocation density in the surfaces which are to be bonded, in particular the materials which have been deposited on the substrates. Contact-making of the two substrate surfaces with a pressure which is as low as possible and a temperature which is preferably as low as possible yields recrystallization of the structure in the bond process, in particular beyond the bond interface.

In order to be able to carry out recrystallization at temperatures which are as low as possible, not only the dislocation density, but also the purity of the recrystallizing material should be as high as possible. The purity is optimally indicated in percent by mass (m %) for technical purposes. The purity of the material is in particular greater than 95 m %, preferably greater than 99 m %, still more preferably greater than 99.9 m %, most preferably greater than 99.99 m %, most preferably of all greater than 99.999 m %.

The grain size of the recrystallizing structure before recrystallization is in particular less than 1000 nm, preferably less than 500 nm, still more preferably less than 100 nm, most preferably less than 50 nm, most preferably of all less than 10 nm. The grain size of the recrystallizing structure after recrystallization is in particular greater than 10 nm, preferably greater than 100 nm, still more preferably greater than 500 nm, most preferably greater than 500 nm, most preferably of all greater than 1000 nm. In one quite especially preferable embodiment the thickness of the grains which have been formed by recrystallization is the same size as the thickness of the recrystallized structure.

In order to increase the mobility of the atoms before and/or during and/or after the recrystallization, the structure preferably has a point defect density, in particular a vacancy density, as large as possible. An increased number of vacancies improves the substitution diffusion and thus contributes to improved joining of the two surfaces which are to be bonded. The vacancy density is in particular greater than $10^{-12}$, preferably greater than $10^{-10}$, still more preferably greater than $10^{-8}$, most preferably greater than $10^{-6}$, most preferably of all greater than $10^{-4}$. A vacancy density of roughly $10^{-4}$ already constitutes the typical boundary value of the vacancy density for metals in the vicinity of the melting point.

Moreover concave shaping of a wafer chuck or a bottom heater for heating the bottom of the substrate which allows bowing/sagging of the wafer in the micron range is conceivable. The concave shaping allows the bowing of the wafer. This bowing, in particular in high frequency stressing of the wafer, can produce additional stress loading and therefore advantageously an increase of the dislocation density in the wafer, in particular in a layer on the wafer. In particular the bowing of the wafer in the region of the wafer near the surface, which is located nearer the concave shaping, produces a tensile stress, while the surface of the wafer which is opposite the concave shaping, is loaded by compressive stress. The tensile or compressive stresses produced by the bending stress decrease in the direction of the neutral line. The maximum values of the tensile or compressive stress can be found in particular on the surfaces of the wafer. Due to the low thickness of the wafer the tensile or compressive stresses produced by bending are very small, but still can have a positive effect on the formation of the metastable state of one of the two layers.

The overall height of a compression apparatus for compressive loading of the substrate stack can be kept low in particular by using piezotechnology and integration into a device of the invention is thus not a problem. This method would, with regard to the adhesive capacity of the two bonded wafers to one another, approach approximately the currently known results of high temperature bonding with respect to the adhesive capacity.

One important advantage is that much lower thermal loading of the partially highly sensitive electronic components which are located on the wafers occurs during bonding and thus the probability of irreparable damage is for the most part precluded or greatly reduced. The lower bond temperature also yields a much lower energy consumption. Moreover low temperature bonding yields a higher throughput since time-consuming cooling of the bonded wafers can be omitted.

An object of this invention is also to show how it is possible to produce an increase in the dislocation density in micron-sized and/or nanometer-sized structures, in particular metals.

The dislocation density is increased mainly by means of ultrasound in the structure. The subject matter of the invention is in particular a device which has at least one oscillating apparatus using which the structure of the regions which are to be bonded to one another can bring into a metastable energy state so that an improved bond action is achieved. In particular the embodiments of the invention increase the dislocation density in the regions of at least one of the two substrates. The embodiments of the invention can be applied to the substrate surfaces before and/or after the substrates make contact. Especially preferably the production of the dislocation density takes place only after the two substrates make contact with one another. But it is also conceivable to produce the dislocation density before contact-making or before and after contact-making.

The device preferably has a thermostat with which the device of the invention can be heated in a monitored manner and in which the bond temperature fluctuates more advantageously in a range from room temperature to distinctly below 300° C. The monitored heating can alternatively be undertaken by a control technology which depending on the substrate material takes into account in particular also other process-relevant parameters in the formulations which are to be used. Treatment of the substrates which have been bonded to one another in an independent external furnace separate from the embodiment of the invention would also be conceivable. Especially preferably it would then be a continuous furnace.

The embodiments of the invention are preferably apparatus which are able to bring at least parts of a preferably entire substrate or a substrate stack which has already been joined to one another by a prebond into a metastable state by an oscillation. The oscillation can be an oscillation with a single period or several periods.

Especially preferably the dislocation generation and structure modification are initiated directly by the device of the invention during the bond process. This can prevent a metastable state which has been produced prior to the bond process from being degraded again by relaxation processes and from no longer being available during the bond process. Of course the production of a metastable state in at least one of the two substrates prior to the bond process and an additional second or subsequent generation or strengthening of a metastable state after contact-making, in particular during the bond process, are also conceivable. In particular, a friction welding process on the microlevel and/or nanolevel which is caused by macroscopic delivery of a force could be involved.

In particular one preferably independent aspect of this invention is supporting the substrate stack on a wafer chuck which is made to allow oscillation and/or deformation of the first and/or second layer. This can take place in particular by locating bearings which are located in particular solely on the periphery of the wafer chuck and/or of the oscillating body for support of the wafer chuck and/or of the oscillating body.

Preferably the two substrates which are to be joined are aligned to one another within an alignment unit (alignment module). In one special alignment process the two substrates make contact with one another in particular from the centric middle of the substrates toward the radial periphery of the substrates.

Dislocations are preferably produced by delivery of mechanical shear stresses. These shear stresses are produced in the grains by stress loading which has been applied outside.

The dislocation density can be produced by each of the following embodiments either prior to contact-making, after contact-making, but prior to bonding or after contact-making during bonding.

In a first embodiment of the invention the dislocation density is produced by a locally concentrated oscillating element. In this embodiment of the invention oscillations are produced by the oscillation element which stresses the substrate or substrate stack in particular in a locally limited manner. The oscillation element can be excited in particular either electrically, mechanically, pneumatically or hydraulically. Especially preferably it is an electrically excitable piezoelectric oscillation device. Moreover a possible spatial separation of the alignment module, oscillation apparatus and/or the bond chamber which is to be used for heating is also conceivable. But to the extent described a combination of the aforementioned apparatus with a cluster is expressly disclosed. A sequence of the individual method steps is likewise disclosed. In one quite especially preferred embodiment bonding of the two substrates by recrystallization at the sites which have already been stressed by the oscillation element takes place solely by the oscillation element. In another preferred embodiment the oscillation element increases only the dislocation density without leading to an immediate recrystallization and thus to immediate bonding. The actual bond process then takes place either in a furnace and/or in its own bond chamber in which the entire substrate stack can be again heated and/or exposed to pressure in a blanket manner.

In other embodiments of the invention the substrate or the substrate stack are set into oscillation in a blanket manner, especially into bending oscillation and/or heavy oscillation. The substrate or the substrate stack rests on a wafer chuck and is fixed, in particular compressively loaded by a pressure plate or a similar device on the side opposite the wafer chuck. Afterwards an especially local oscillating force or one which at least does not cover the entire surface of the substrate or substrate stack is applied. This application of force sets the entire substrate or the entire substrate stack into oscillations. In doing so the substrate holder and/or the pressure plate are in particular designed such as to be able to concomitantly oscillate themselves. Use of a stable and thick wafer chuck and a stable pressure plate in order to produce an oscillating shear stress on the substrate or the substrate stack would also be conceivable. Similar considerations also apply to torsional stress which in any case does not constitute the preferred embodiment due to the radial dependency of the deformation on the center of the substrate or of the substrate stack.

In another embodiment of the invention the generation of a metastable equilibrium, especially a dislocation-rich layer, is based on the use of a static wafer chuck and/or a static, nonplanar pressure plate. The wafer chuck and/or the pressure plate are preferably shaped concavely and/or convexly. In one special embodiment they are formed from an elastic material which in the unloaded state does have a planar surface, but can deform accordingly concavely and/or convexly under compressive loading. This shaping possibly likewise forces the substrate stack into a concave and/or convex shape; this leads to a corresponding stress on the substrate stack and thus on the surfaces which are to be bonded to one another. In particular, in contrast to the embodiments which were already named above, not dynamic, oscillating compressive stress, but a purely static, in particular blanket compressive stress on the substrate stack takes place.

In one quite special embodiment of the invention the elasticity of the wafer chuck is used to produce an aspect of the invention. The wafer chuck has a certain elasticity and is thus able to deform under compressive loading. The wafer chuck can fundamentally be shaped as desired, preferably convexly, concavely or in a planar manner. In this special embodiment of the invention mainly a planar wafer chuck is suitable. Therefore hereinafter reference is made to a planar wafer chuck. Slightly concave elastic deformation is effected by applying pressure to the elastically deformable wafer chuck which is planar however prior to the elastic deformation. The wafer chuck is more strongly elastically deformed in the middle than on the edge. The maximum deformation in generally any direction, but in particular in the direction of the force, is in particular less than 1 mm, preferably less than 100 µm, still more preferably less than 10 µm, most preferably less than 1 µm, most preferably of all less than 100 nm. The modulus of elasticity of the material from which the wafer chuck is produced is in particular greater than 10 MPa, preferably greater than 100 MPa, still more preferably greater than 1 GPa, most preferably greater than 10 GPa, most preferably of all greater than 100 GPa. The inventive aspect of this embodiment includes in particular in applying a force, especially a surface force, to the substrate stack. The substrate stack is more or less forced into the wafer chuck which is minimally deformed, in particular concavely, by the elasticity of the wafer chuck. Due to this extremely slight bowing of the substrate stack the two surfaces of the two substrates which are not yet bonded to one another are slightly shifted laterally, in particular along their bond interface, to one another. The resulting friction between the two surfaces which are to be bonded to one another causes the generation of the metastable state, in particular of the dislocation-rich structure. When the substrate stack is unloaded the elastic energy in the wafer chuck is used to transfer the wafer chuck as well as the substrate stack again into its initial shape. In doing so repeated friction which however acts in the opposite direction occurs in the substrate stack. This process can if necessary be repeated as often as wished.

In another embodiment of the invention, it is also conceivable to configure the compressive loading apparatus and/or the wafer chuck and/or the entire system in terms of construction technology such that a noteworthy bowing of the wafer chuck and thus also of the substrate stack to be stressed takes place only during loading. In particular this especially preferred embodiment is implemented such that the wafer chuck on its periphery is supported (preferably solely), in particular around the entire circumference, by a bearing, in particular a locating bearing, while the center is not supported or is only supported compliantly. In this special embodiment the wafer chuck and thus the substrate stack in the unloaded case, ignoring the effect of gravity and production tolerances, can be considered planar, bow concavely in the middle in any case under a load, preferably a spot load along the axis of symmetry of the pressure piston, still more preferably a surface load along the pressure plate.

One important aspect of the invention is the generation of a metastable state, in particular of a structure with increased dislocation density in the surfaces of two surfaces which are to be bonded to one another, by elastic deformation of the wafer chuck and by friction between the two surfaces which has been caused by it.

In order to apply the stresses mentioned in the preceding paragraph, supporting the substrate or the substrate stack on different wafer chucks is conceivable. The wafer chucks can be supported in a blanket manner or only on their periphery.

The amplitudes of the oscillation exciter are in particular smaller than 100 µm, preferably smaller than 1 µm, more preferably smaller than 100 nm, most preferably smaller than 10 nm.

The lateral displacements which are in particular parallel to the substrate surface and which are produced by the amplitudes can assume theoretically any values during the process as long as after completion of the process they assume a residual alignment fault which is smaller than 100 µm, preferably smaller than 1 µm, more preferably smaller than 100 nm, most preferably smaller than 10 nm. In particular the lateral displacements are set to be smaller than 10 µm, preferably smaller than 1 µm, more preferably smaller than 100 nm, most preferably smaller than 10 nm. The vertical displacements during the process are in particular smaller than 10 µm, preferably smaller than 1 µm, more preferably smaller than 100 nm, most preferably smaller than 10 nm.

At least one compressive prestress applied especially in a blanket manner to the substrate or substrate stack is produced. The compressive prestresses are in particular greater than 10 N/mm$^2$, preferably greater than 100 N/mm$^2$, more preferably greater than 200 N/mm, most preferably greater than 1000 N/mm$^2$.

The compressive prestress or the von-Mises comparison stress is in particular greater than the yield point of the material of the substrate or of the layer which is located on the substrate and which is to be used for bonding in order to support plastic deformation which additionally promotes the corresponding dislocation formation. The yield point of the material is preferably smaller than 5000 N/mm$^2$, preferably smaller than 1000 N/mm$^2$, still more preferably smaller than 750 N/mm$^2$, most preferably smaller than 500 N/mm$^2$, most preferably of all smaller than 300 N/mm$^2$. The tensile strength of the material is preferably smaller than 5000 N/mm$^2$, preferably smaller than 1000 N/mm$^2$, still more preferably smaller than 750 N/mm$^2$, most preferably smaller than 500 N/mm$^2$, most preferably of all smaller than 300 N/mm$^2$. Pure copper which has not been cold-deformed and which is therefore not yet work-hardened has for example a yield point of roughly 70 N/mm and a tensile strength of roughly 200 N/mm$^2$.

Additional forces which can change over time are produced by superposition of the oscillating stress with the prestress. By the prestress, in particular beyond the yield point of the material, the latter is at least in the flow region of the material with a positive half-wave.

Another inventive effect which benefits the bond properties is the heat energy which has been delivered into the system by the devices of the invention and the temperature which can be reached with it. Mainly in the embodiment of a locally concentrated oscillation element can a very high heat density and thus a very high temperature be produced by which the bond process can be locally initiated.

Further heat treatment can be especially advantageously omitted in this case. Recrystallization takes place preferably at a temperature as low as possible, as a result of which the temperature which can preferably be produced by the local oscillation element can be accordingly low. The temperature which has been produced by a locally concentrated oscillation element is in particular less than 800° C., preferably less than 600° C., still more preferably less than 400° C., most preferably less than 200° C., most preferably of all less than 50° C.

Regardless of the embodiment of the invention which has been used, the substrate stack after successful treatment can be heat-treated in an external furnace which is separate from the embodiment of the invention. Regardless of the aforementioned use of a separate furnace, the heat treatment is also possible in the bond chamber or in any other module which has been implemented in the process chain. In particular only by heat treatment does the predominant recrystallization of the structure and thus the actual permanent bond take place. Recrystallization takes place preferably at a temperature which is as low as possible. The temperature in the furnace or bonder is in particular less than 800° C., preferably less than 600° C., still more preferably less than 400° C., most preferably less than 200° C., most preferably of all less than 50° C.

BRIEF DESCRIPTION OF THE DRAWINGS

FIG. 4a shows a schematic cross section of a third embodiment of the invention in a first state, FIG. 4b shows a schematic cross section of the third embodiment of the invention in a second state, FIG. 4c shows a schematic cross section of the third embodiment of the invention in a third state, FIG. 4d shows a schematic of a loading diagram of the third embodiment of the invention, FIG. 10 shows a schematic, not to scale, of a sixth embodiment of a device of the invention for producing a static compressive stress with material-referenced compliance of the wafer chuck and FIG. 11 shows a schematic, not to scale, of a seventh embodiment of a device of the invention for producing a static compressive stress with a construction-engineering compliance of the wafer chuck.

DETAILED DESCRIPTION OF THE INVENTION

Figure 1A:
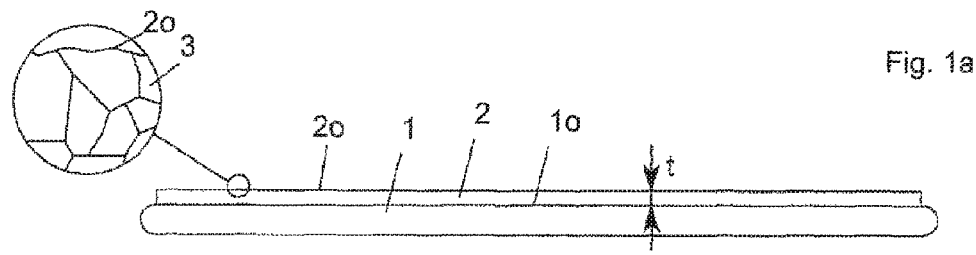
FIG. 1a shows a schematic cross section of a coated substrate and an enlargement of the microstructure of the coating.

FIG. 1a shows a substrate 1 with a layer 2 applied to a substrate surface 1o, in particular a metal layer, especially preferably a Cu layer. The enlargement represents a microstructure of the layer 2 comprised of several grains 3. In the case of very small layer thicknesses t, there can also be only one grain 3 in the direction of the layer thickness. The layer surface 2o of the layer 2 and the substrate surface 1o are generally provided with roughness which does not disappear. In particular the roughness is negligibly small, especially preferably it is not present at all. The roughness is specified either as the average roughness, the quadratic roughness or as averaged peak-to-valley height. The determined values for the average roughness, the quadratic roughness and the averaged peak-to-valley height differ generally for the same measured distance or measured area, but are of the same range of magnitude. Therefore the following ranges of numerical values for the roughness should be understood either as values for the average roughness, the quadratic roughness or for the averaged peak-to-valley height. The roughness is in particular less than 100 μm, preferably less than 1 μm, still more preferably less than 100 nm, most preferably less than 10 nm, most preferably of all less than 1 nm.

At this point the dislocation density is increased in the grains 3 of the layer 2 by any method of the invention. Several dislocations 4 arise. The grains 3 for this reason pass into grains 3' with a correspondingly high dislocation density. The energy state of the grains 3' is at least partially, preferably predominantly, metastable.

Two substrates 1, 1' which have been prepared by one of the embodiments of the invention with layers 2, 2' are at this point brought into contact with one another or bonded to one another. In making contact between the two substrates with functional units, a prior alignment of substrates to one another can be necessary. In one special embodiment the dislocation density in the layers 2, 2' of the substrates 1, 1' is increased before and/or after making contact. In this state the two layers 2, 2' of the substrates 1, 1' are in close contact with one another and are in a metastable state.

Figure 1B:
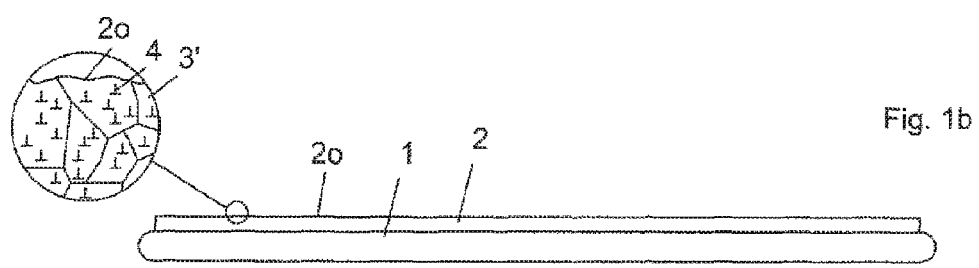
FIG. 1b shows a schematic cross section of a coated substrate and an enlargement of the microstructure of the coating after an increase of the dislocation density.
Figure 1C:
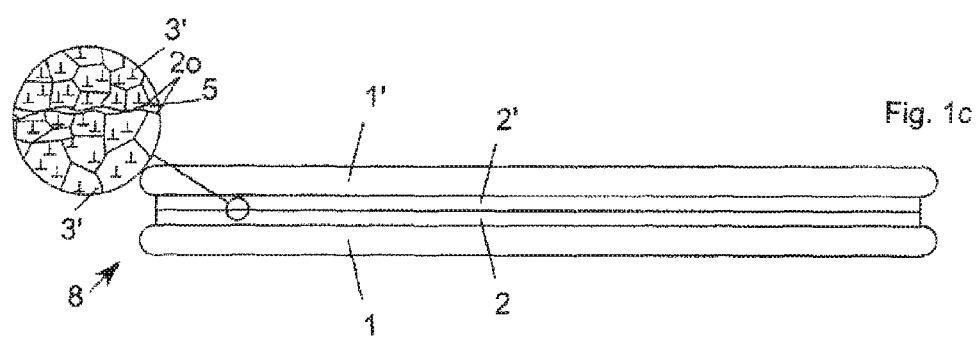
FIG. 1c shows a schematic cross section of two coated substrates after the contact-making process and an enlargement of the microstructure of the coatings.
Figure 1D:
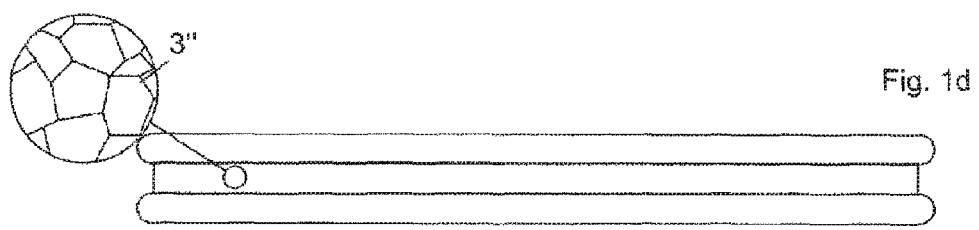
FIG. 1d shows a schematic cross section of two coated substrates after a bond process and an enlargement of the recrystallized microstructure which has taken place via the bond interface.

FIG. 1*d* shows the successful regeneration of the structure by recrystallization beyond a bond interface 5. The regeneration of the structure by recrystallization is initiated preferably by an especially slight temperature increase. The temperature increase is initiated either by one of the embodiments of the invention or is carried out in an external furnace which is separate from the embodiment of the invention, in particular a continuous furnace. A main idea of the invention is that the temperature of the regeneration of the structure can be lowered to an extreme degree by the increased dislocation density of the grains 3'. The temperature during bonding is in particular less than 300° C., preferably less than 200'C, more preferably less than 150° C., especially preferably less than 100° C., most preferably less than 50° C. In one special embodiment the average roughness of the substrate surface 1*o* is less than 100 μm, preferably less than 10 μm, more preferably less than 1 μm, most preferably less than 100 nm, most preferably of all less than 10 nm.

In order to carry out the bond process shown in FIGS. 1*a*-1*d*, several inventive embodiments are presented below which could effect the increase of the dislocation density in the grains 3. It is mentioned once again that the increase of the dislocation density in each layer 2 of each substrate 1 can be produced before and/or after the two substrates make contact. FIGS. 1*a*-1*b* show the production of a dislocation-rich layer 2 before the actual bond process.

In a first embodiment of the invention an oscillation apparatus 6 is used which can move along one substrate back 1*r* in one direction of motion. One contact surface 6*k* of the oscillation device 6 is in particular smaller than the substrate surface 1*o*. The ratio between the contact surface 6*k* and the substrate surface 1*o* is in particular smaller than ½, preferably smaller than ⅙, more preferably smaller than ⅒, most preferably smaller than 1/20, most preferably of all smaller than 1/100. An extremely small contact surface 6*k* can transfer extremely high point forces to the substrate stack 8 which has been formed from the substrates 1, 1' which have made contact on the layers 2, 2' and thus to the layers 2.

Figure 2A:
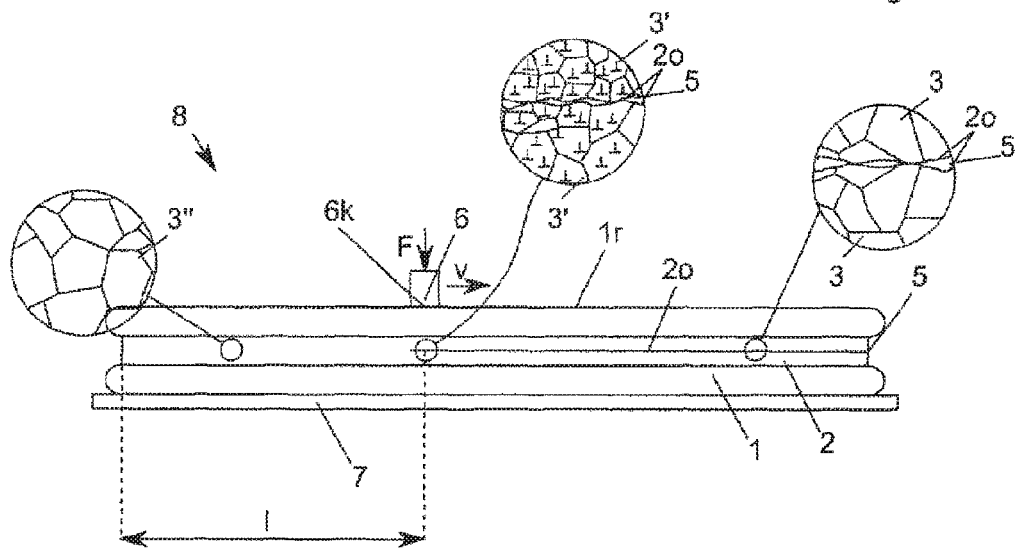
FIG. 2a shows a schematic cross section of a first embodiment of the invention which acts directly on the surface of a substrate and leads immediately to regeneration of the structure beyond the bond interface.

The oscillation apparatus 6 places the substrate stack 8 locally under compressive stress by a preliminary compressive force and/or compressive prestress in the direction of one wafer chuck 7 for accommodating the substrate stack 8. Afterwards a periodic, preferably high frequency oscillation is superimposed on the positive compressive prestress F. The high frequency oscillation leads to a local cyclic load on the layers 2, 2'. Due to the cyclic loads the layers 2, 2' are preferably exposed to a stress state which is suitable for producing dislocations 4 in the grains 3. The metallurgical prerequisites such as for example Frank-Read sources, for producing these dislocations are known to one skilled in the art. The oscillation apparatus 6 moves with a velocity V over the substrate stack 8 and in doing so is always loaded by a compressive force f. The oscillation apparatus 6 associated with the compressive force f yields a temperature of roughly 20-40% of the melting point of the layers 2, 2' and subsequently recrystallization occurs by which a nonpositive connection to the substrate stack occurs. In FIG. 2*a* the bond interface 5 has already been closed along a distance L since by the loading of the oscillation apparatus 6 dislocations 4 have already been delivered into the grains 3 and/or heat into the bond interface 5 sufficient to cause regeneration of the structure.

Figure 2B:
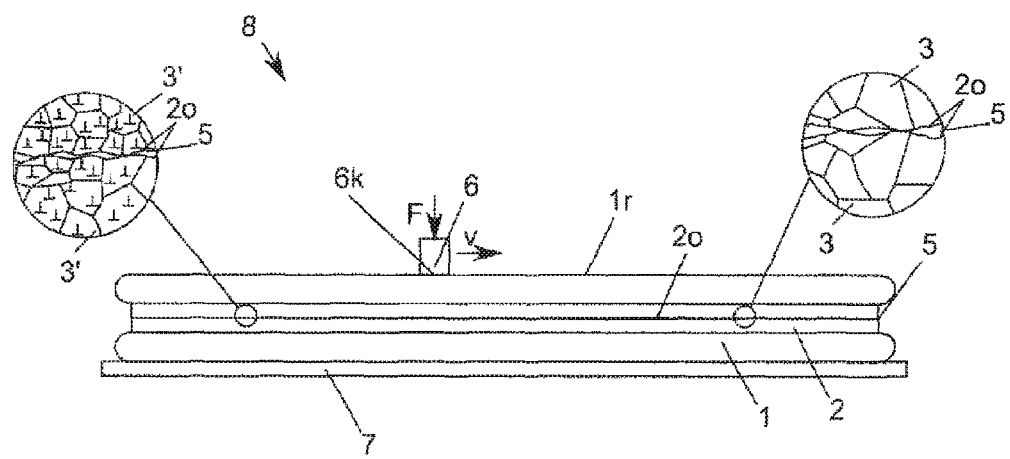
FIG. 2b shows a schematic cross section of a first embodiment of the invention which acts directly on the surface of a substrate and does not lead to regeneration of the structure beyond the bond interface.

In many embodiments this in-situ regeneration of the structure could be undesirable and must be prevented by the correct choice of the process parameters so that a metastable structure with grains 3' is preserved up to the explicitly conducted heat treatment. This situation is shown in FIG. 2*b*. The oscillation apparatus 6 does produce dislocations 4 in the structures of the two layers 2 which are preferably welded at least in spots; recrystallization which is necessary for regeneration of the structure beyond the bond interface 5 preferably does not yet take place at this instant.

Figure 3A:
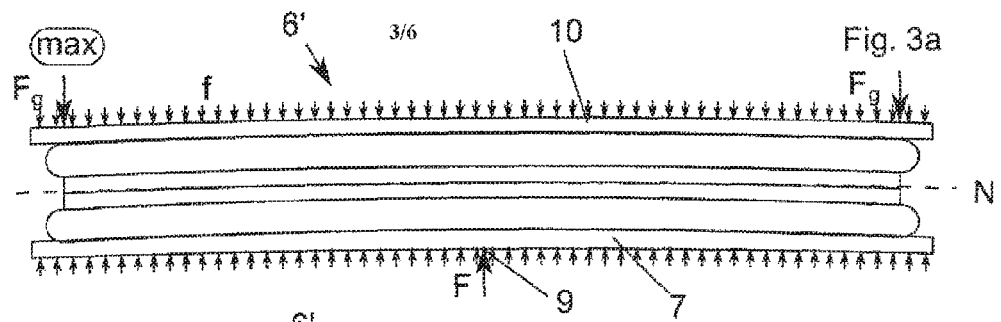
FIG. 3a shows a schematic cross section of a second embodiment of the invention in a first state.
Figure 3B:
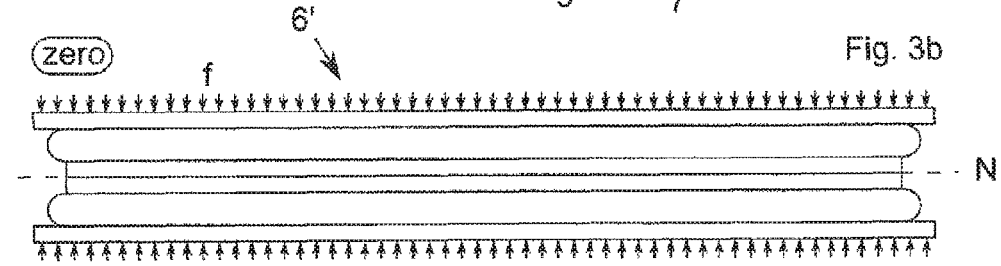
FIG. 3b shows a schematic cross section of the second embodiment of the invention in a second state.
Figure 3C:
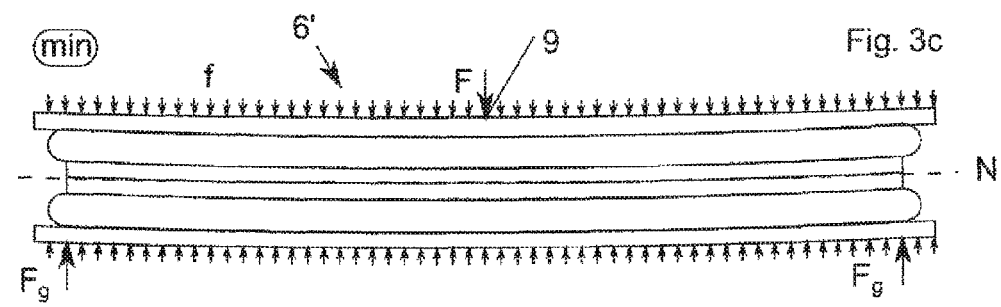
FIG. 3c shows a schematic cross section of the second embodiment of the invention in a third state.

FIGS. 3*a*-3*c* show three (global) oscillation states of a second embodiment of the invention with an oscillation apparatus 6'. This oscillation apparatus 6' is characterized in that the substrate stack 8 is deformed by a blanket oscillation which is extended over the entire bond interface of the substrate stack 8. The substrate stack 8 is pretensioned in doing so by a surface force f over the entire substrate surface 1*o* and is kept under pressure during the entire oscillation loading.

The embodiment of the invention has at least one lower wafer chuck 7 on which the substrate stack 8 can lie. Especially preferably there is opposite fixing, for example a pressure plate 10.

The force F which produces a local oscillation superposition to the surface force f is initiated on one oscillation area 9. By delivering a force in an especially local, preferably point oscillation region 9, the substrate stack is deflected in the direction of one normal to the substrate surface 1*o*, a counterforce Fg being produced in particular by one bearing at a time or one holder of the substrates 1, 1' or of the wafer chuck 7 and the pressure plate 10 at a time. The oscillation region 9 need not lie centrically, but can act on any position of the substrate surface 1*o*.

Figure 3D:
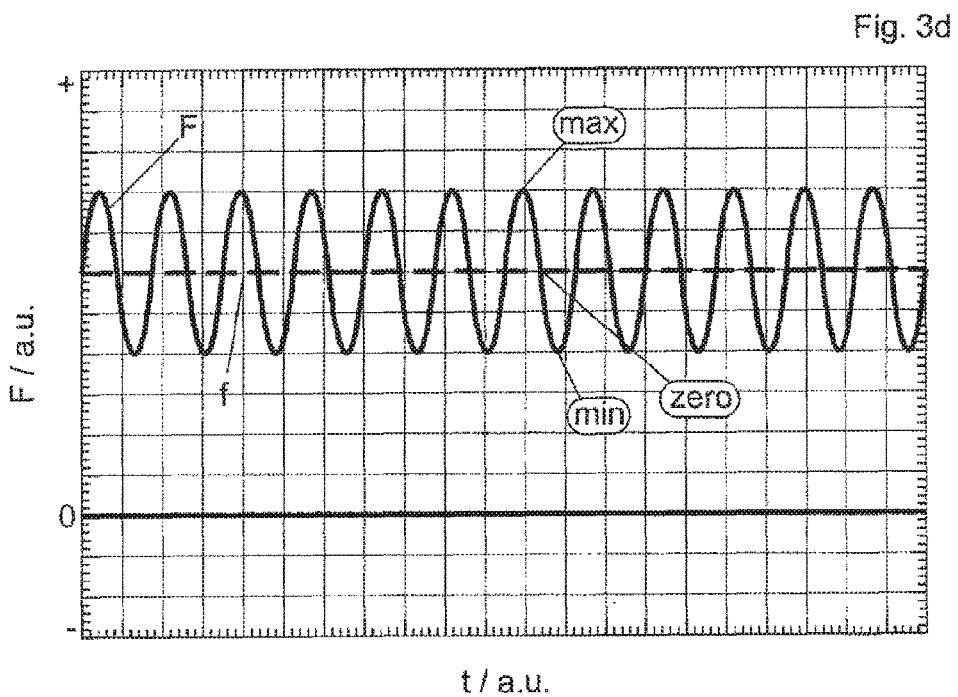
FIG. 3d shows a schematic of a loading diagram of the second embodiment of the invention.

FIG. 3*d* shows a schematic of the force loading which changes over time and which is composed of the surface force f which is constant in time (broken line) and the superimposed, periodic, in particular local force application F. It is recognizable that the resulting force is always in the positive pressure domain so that the substrates 1, 1' are always pressed onto one another.

The force is delivered via the oscillation region 9 in particular via piezoelements, hydraulic, pneumatic or mechanically controlled pins which provide for the wafer chuck 7 and/or the pressure plate 10 and thus the substrate stack 8 to be deformed accordingly, in particular bent, based on the counterforce Fg which is aligned and/or congruent with the oscillation force F.

The bending produces in the layers 2, 2' a stress state and in this way the increased dislocation density. Instead of the wafer chuck 7 and/or the pressure plate 10, circular sleeve bearings would be conceivable on which the substrate stack 8 is supported. In this way the substrate surfaces 1*o* are directly accessible to the electrical, mechanical, pneumatic or hydraulic oscillation elements. Even an embodiment would be conceivable in which the circular support itself is produced from a piezomaterial. Afterwards the substrate stack is fixed on the circular support. The substrate stack 8 is brought accordingly into resonance by the piezo-oscillations of the circular support and oscillates under the initial and boundary conditions which are defined on the edge. Electrical, mechanical, pneumatic or hydraulic deformation elements in the center can be omitted by this special embodiment.

FIGS. 4*a*-4*d* show an analogous embodiment with the difference of a shear stress T acting on the substrate stack 8. The shearing of the substrate stack 8 in FIGS. 4*a* and 4*c* is shown exaggerated. The shear angle is only a few degrees.

The shear angle is in particular smaller than 10°, preferably smaller than 1°, more preferably smaller than 0.1°, most preferably smaller than 0.01°, most preferably of all smaller than 0.001°. For shearing of the substrate stack 8 there is preferably blanket contact-making of the substrate back 1r, in particular with a wafer chuck 7''' and/or a pressure plate 10' according to FIG. 8.

Figure 5:
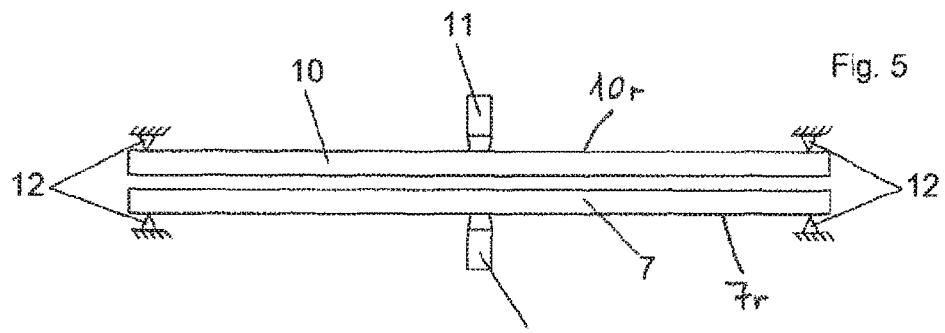
FIG. 5 shows a schematic, not to scale, of a first embodiment of a device of the invention for producing a blanket bending oscillation.

FIG. 5 shows a first embodiment of the invention for producing a blanket bending oscillation comprising a wafer chuck 7 which is planar in particular in the resting state for accommodating and holding/fixing the substrate stack 8 and a pressure plate 10 which is planar in particular in the resting state. The wafer chuck 7 and the pressure plate 10 are fixed on their backs (7r, 10r) and/or peripheries via at least three point locating bearings 12 at a time or a single radially symmetrical locating bearing around the entire circumference. Two oscillation elements 11 which are made in particular as piezoelements are able to deflect the wafer chuck 7 and the pressure plate 10 normally to their surface and to expose to bending stress, in particular cyclically, the substrate stack 8 which is fixed between them. In particular the embodiment of the invention can also apply a preliminary compressive force f or prestress, preferably by moving one or both oscillation elements 11.

Figure 6:
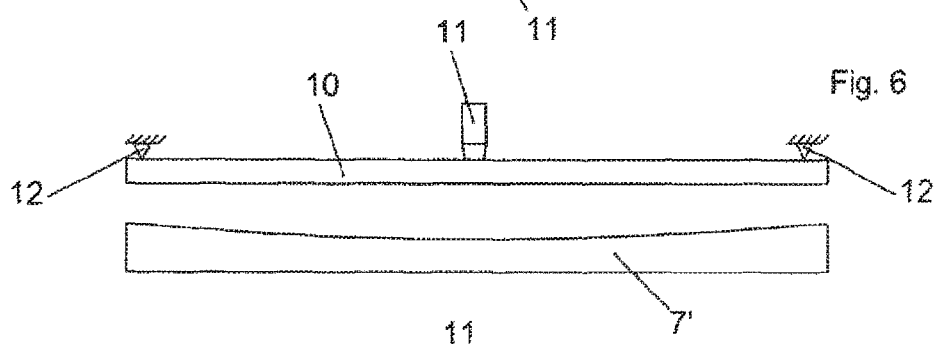
FIG. 6 shows a schematic, not to scale, of a second embodiment of a device of the invention for producing a blanket bending oscillation.

FIG. 6 shows a second embodiment of the invention for producing a blanket bending oscillation comprising a wafer chuck 7' and a pressure plate 10 which is planar in the resting state. The wafer chuck 7' is concavely shaped on its receiving side 7o. The pressure plate 10 is made analogously to the first embodiment according to FIG. 5. The substrate stack 8 is pressed into the static, concave shape of the wafer chuck 7' here by a single upper oscillation element 11. In particular the embodiment of the invention can also apply a preliminary compressive force f or prestress, preferably by moving the oscillation element 11 in the direction of the wafer chuck 7'. The preliminary compressive force f is preferably applied to press the substrate stack 8 into the concave shape of the wafer chuck 7' and to expose it constantly to pressure in this curved shape. Afterwards preferably the superposition of the oscillating stress takes place by the oscillation element 11.

Figure 7:
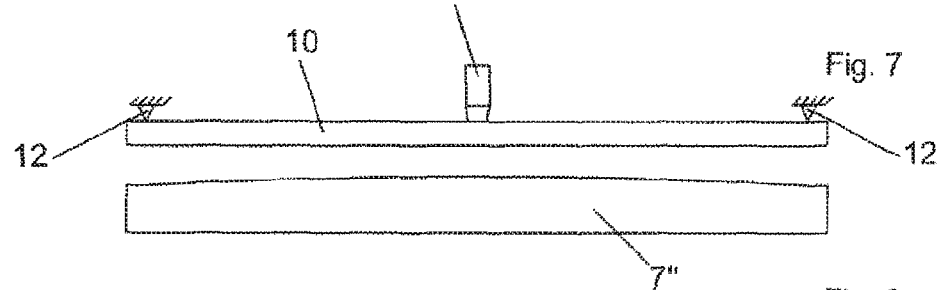
FIG. 7 shows a schematic, not to scale, of a third embodiment of a device of the invention for producing a blanket bending oscillation.

FIG. 7 shows a third embodiment of the invention for producing a blanket bending oscillating with a convex wafer chuck 7". Otherwise the structure and the function correspond to the second embodiment according to FIG. 6.

Figure 8:
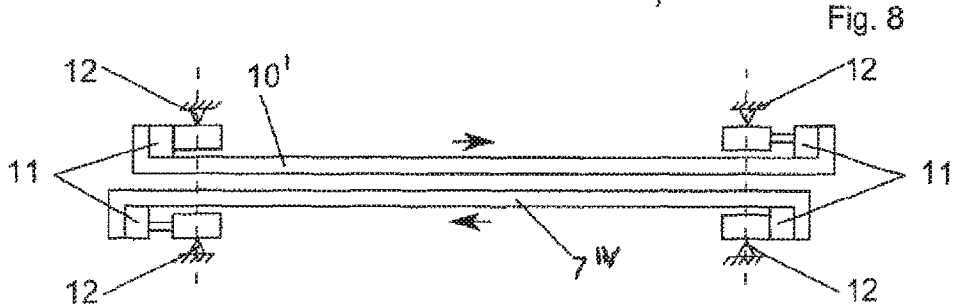
FIG. 8 shows a schematic, not to scale, of a fourth embodiment of a device of the invention for producing a blanket shear oscillation.

FIG. 8 shows a fourth embodiment of the invention for producing a blanket shear stress (see FIG. 4a to 4c). The substrate stack 8 is fixed by pressure between the planar wafer chuck 7$^{IV}$ and the planar pressure plate 10'. Afterwards shearing of the substrate stack 8 takes place by opposite oscillating movement of the wafer chuck 7$^{IV}$ and the pressure plate 10 to one another. The movement takes place by means of oscillation elements 11' which are located on the side periphery of the wafer chuck 7$^{IV}$ and the pressure plate 10'. The locating bearings 12 are used as fixing points for the oscillation elements 11' which are made in particular as piezoelements and which are each located between each locating bearing 12 and the wafer chuck 7$^{IV}$ of the pressure plate 10'.

Figure 9:
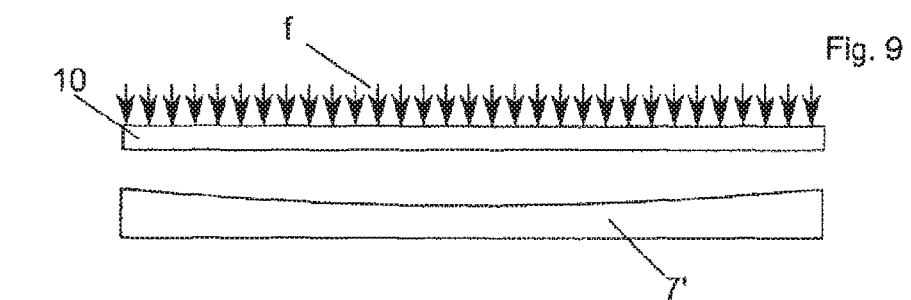
FIG. 9 shows a schematic, not to scale, of a fifth embodiment of a device of the invention for producing a blanket static compressive stress.

FIG. 9 shows a fourth embodiment of the invention with a pressure plate 10 and a static, concavely curved wafer chuck 7' analogously to FIG. 6. A preliminary compressive load f made as a surface load is applied to the pressure plate 10. The pressure plate 10 presses the substrate stack 8 (not shown) onto the concave wafer chuck 7' and in this way produces in the surfaces which have been bonded to one another a metastable state, in particular an increased dislocation density. Instead of the concavely formed wafer chuck 7', the convexly made wafer chuck 7" can be used in exactly the same way, as is shown in FIG. 7.

In particular the use of a wafer chuck 7''' according to FIG. 10 is also possible; it comprises an elastic material such that it is brought into a concave shape only by the preliminary compressive force f which is applied via the pressure plate 10 (in this special case this is in particular the blanket bond force). The wafer chuck 7''' behaves in particular elastically so that after removing the preliminary compressive force f, in particular a surface force, it returns again into its original initial position.

One aspect of the invention in this embodiment includes in particular in the adhesive friction between the surfaces which have not yet been bonded to one another prior to the process of the invention, while the preliminary compressive force f presses on the substrate stack and presses it, due to the elasticity of the material of the wafer chuck 7''', into the latter. The wafer chuck 7''' therefore yields, based on the material-specific parameters, such as the modulus of elasticity. In particular the wafer chuck 7''' is deformed in an elastically concave manner when the modulus of elasticity of the wafer chuck 7''' rises from the center toward the edge, the wafer chuck 7''' therefore according to one preferred embodiment has a gradient of the modulus of elasticity and/or the surface force f does not constitute a steady load, but a surface load which decreases from the center to the edge.

FIG. 11 shows one especially preferred embodiment of a wafer chuck 7 which is fixed on locating bearings 12. The wafer chuck 7 can either lie directly on the locating bearings 12 or more preferably can lie on construction elements which are located between the wafer chuck 7 and the locating bearings 12. FIG. 11 therefore constitutes only a very schematic sketch. The idea of the invention is that the wafer chuck 7 which accommodates the substrate stack 8 is supported such that the force flows out via the locating bearings 12 when pressure is applied and the wafer chuck 7 is centrically bowed.

The locating bearings 12 are in particular radially symmetrical, fully circumferential locating bearings which are located in the position of the outer periphery of the wafer chuck 7. The pressure plate 10 which is opposite the wafer chuck 7 is preferably fixed on a pressure piston 13, in particular the pressure piston 13 of a bonder. The substrate stack 8 (not shown) which is positioned between the pressure plate 10 and the wafer chuck 7 is loaded by pressure by a relative approach of the pressure plate 10 and the wafer chuck 7 to one another, in particular by a movement of the pressure piston 13. The pressure piston 13 is preferably produced such that a centric point force during the advancing compressive loading is converted into a homogenous surface force.

In any case a transfer of a centric point force via the pressure piston 13 and the pressure plate 10 to the substrate stack 8 is also conceivable. Under this compressive loading the wafer chuck 7 and thus also the substrate stack 8 bow centrically and thus concavely, and are peripherally supported by the locating bearings 12. In contrast to the embodiment of the invention shown in FIG. 10, the concave bowing takes place, not on the basis of material-specific parameters such as a modulus of elasticity or a gradient of the modulus of elasticity, but on the basis of construction engineering features, in particular a solely peripheral, in particular completely circumferential support of the wafer chuck 7 by the locating bearings 12.

A substrate stack 8 and thus the individual substrates 1, 1' are in turn pushed toward one another by the aforementioned embodiment of the invention such that by loading, in particular friction between the layers 2, 2', an inventive effect of producing a metastable equilibrium, in particular of a structure with elevated dislocation structure is produced which subsequently leads to a more optimum joining of the two substrates 1, 1' via the layers 2, 2'.

REFERENCE NUMBER LIST 1, 1' substrate
1o substrate surface
1r substrate back
2, 2' layers
2o layer surface
3 grain
3' metastable grain with high dislocation density
4 dislocation
5 bond interface
6, 6' oscillation apparatus
6k contact surface
7,7',7", 7"', $7^{IV}$ wafer chuck
7r backs
8 substrate stack
9 point of force application
10, 10' pressure plate
10r backs
11 oscillating element, in particular piezoelement(s)
12 locating bearing
13 pressure piston
T layer thickness
v movement device/velocity
f preliminary compressive force
F; oscillation force
L distance
T shear stress
Fg counterforce Having described the invention, the following is claimed:

1. A method for permanent bonding of a first layer of a first substrate to a second layer of a second substrate at a bond interface, the method comprising:
    increasing a dislocation density of a dislocation in the first and/or second layer at least in the region of the bond interface before and/or during bonding of the first layer to the second layer, wherein the dislocation is a one-dimensional lattice defect,
    mounting a substrate stack, comprised of the first and the second substrates, on a wafer chuck, the wafer chuck allowing a deformation of the first and/or the second layer,
    wherein the wafer chuck and/or a pressure plate are concave and/or convex shaped during a pressure application to apply pressure on the entire surface of the substrate stack for bonding the first and the second layers, and
    wherein the wafer chuck and/or the pressure plate are deformed before and/or during the pressure application to increase the dislocation density of the dislocation at least in the region of the bond interface.

2. The method as claimed in claim 1, wherein the method further comprises:
    increasing the dislocation density by delivering at least one oscillation, each oscillation applying a load to the substrate stack, wherein the at least one oscillation is delivered by an oscillation apparatus operating in the ultrasonic range.

3. The method as claimed in one of claim 1, wherein a bond temperature is a maximum of 300° C. during bonding of the first layer to the second layer.

4. The method as claimed in claim 1, wherein the first layer and/or the second layer is metallic and the first substrate and/or second substrate is a semiconductor.

5. The method as claimed in claim 2, wherein delivering said at least one oscillation with a minimum resulting force that is greater than 0 superimposes a compressive force f on the first and the second substrates that acts transversely to the bond interfaces.

6. The method as claimed in claim 1, wherein the dislocation density is increased by delivering a plurality of oscillations.

7. The method as claimed in claim 4, wherein the first layer and/or the second layer is Cu.

8. A device for permanent bonding of a first layer of a first substrate to a second layer of a second substrate at a bond interface, the device comprising:
    a wafer chuck for receiving the first substrate, wherein a substrate stack comprised of the first and the second substrates is mounted on the wafer chuck, the wafer chuck allowing a deformation of the first layer and/or the second layer; and
    a pressure plate for loading the first and the second substrates to increase a dislocation density of a dislocation of the first layer and/or the second layer at least in the region of the bond interface, wherein the dislocation is a one-dimensional lattice defect,
    wherein the wafer chuck and/or the pressure plate is concave and/or convex shaped during a pressure application to apply pressure to the entire surface of the substrate stack for bonding the first and the second layers, and
    wherein deformation of the wafer chuck and/or the pressure plate before and/or during the pressure application increases the dislocation density of the dislocation of the first layer and/or the second layer at least in the region of the bond interface.

9. The device as claimed in claim 8, wherein the device further comprises:
    locating bearings for supporting the wafer chuck and/or the pressure plate, wherein the wafer chuck and/or pressure plate are supported by the locating bearing on their respective back sides.

10. The device as claimed in claim 8, wherein the loading of the first and the second substrates takes place by delivery of at least one oscillation, each oscillation applying a load to the substrate stack.

11. The device as claimed in claim 10, wherein the loading of the first and the second substrates takes place by delivery of a plurality of oscillations.

* * * * *